US008179676B2

(12) United States Patent
Julien et al.

(10) Patent No.: US 8,179,676 B2
(45) Date of Patent: May 15, 2012

(54) OPTICAL INTERCONNECTS IN COOLING SUBSTRATES

(75) Inventors: Martin Julien, Laval (CA); Robert Brunner, Montreal (CA)

(73) Assignee: Telefonaktiebolaget L M Ericsson (publ), Stockholm (SE)

(*) Notice: Subject to any disclaimer, the term of this patent is extended or adjusted under 35 U.S.C. 154(b) by 120 days.

(21) Appl. No.: 12/840,766

(22) Filed: Jul. 21, 2010

(65) Prior Publication Data

US 2012/0020020 A1 Jan. 26, 2012

(51) Int. Cl.
H05K 7/20 (2006.01)
G02B 6/36 (2006.01)

(52) U.S. Cl. ........... 361/688; 361/679.46; 361/679.53; 361/689; 361/699; 361/715; 257/714; 165/80.4; 165/104.19; 385/88; 385/92; 385/94

(58) Field of Classification Search ............ 361/679.46–679.54, 688, 689, 361/698, 699, 700, 715–724, 727, 732, 756, 361/831; 165/80.2, 80.3, 80.4, 80.5, 104.19, 165/104.33, 104.34, 185, 104.21, 104.22; 257/706–727; 174/15.1, 16.3, 252; 62/259.2; 385/9, 14, 27, 50, 88–94, 123–135, 137, 385/29, 53, 147
See application file for complete search history.

(56) References Cited

U.S. PATENT DOCUMENTS

| | | | | |
|---|---|---|---|---|
| 4,998,803 A * | 3/1991 | Salour et al. | | 359/896 |
| 5,200,631 A * | 4/1993 | Austin et al. | | 257/570 |
| 5,724,468 A * | 3/1998 | Leone et al. | | 385/134 |
| 5,929,518 A | 7/1999 | Schlaiss | | |
| 5,980,312 A * | 11/1999 | Chapman et al. | | 439/540.1 |
| 6,005,991 A * | 12/1999 | Knasel | | 385/14 |
| 6,270,262 B1 * | 8/2001 | Hudgins et al. | | 385/88 |
| 6,623,177 B1 * | 9/2003 | Chilton | | 385/88 |
| 6,693,736 B1 * | 2/2004 | Yoshimura et al. | | 359/333 |
| 6,717,060 B2 * | 4/2004 | Kragl et al. | | 174/255 |
| 6,788,867 B2 * | 9/2004 | Mule' et al. | | 385/129 |
| 6,845,184 B1 | 1/2005 | Yoshimura et al. | | |
| 7,058,274 B2 * | 6/2006 | Doyle | | 385/134 |
| 7,119,284 B2 * | 10/2006 | Bel et al. | | 174/252 |
| 7,149,389 B2 * | 12/2006 | Yoon et al. | | 385/43 |
| 7,254,024 B2 * | 8/2007 | Salmon | | 361/699 |
| 7,274,851 B2 * | 9/2007 | Morris | | 385/135 |

(Continued)

FOREIGN PATENT DOCUMENTS

GB 2221100 A1 1/1990

(Continued)

OTHER PUBLICATIONS

International Search Report for PCT/IB2011/053201 with mailing date of Oct. 19, 2011; 5 pages.

Primary Examiner — Michail V Datskovskiy
(74) Attorney, Agent, or Firm — Ericsson Canada Inc.

(57) ABSTRACT

Fluid-cooling technology developed for printed circuit boards (PCBs) and electronics assemblies is combined with optical-based interconnect technology, thereby enabling efficient fabrication of PCBs with free-space optical bearers. Since cooling components such as fans and heat sinks are no longer required on the PCB, the PCB is thinner and makes better use of a cooling substrate by also using it to carry optical signals. A card or a backplane supporting a plurality of active components can combine optical signals and cooling aspects in support of those components.

15 Claims, 4 Drawing Sheets

U.S. PATENT DOCUMENTS

| | | | |
|---|---|---|---|
| 7,412,123 B1 * | 8/2008 | Mader et al. | 385/14 |
| 7,457,491 B2 * | 11/2008 | Chen et al. | 385/14 |
| 7,515,416 B2 * | 4/2009 | McBain et al. | 361/699 |
| 7,586,747 B2 * | 9/2009 | Salmon | 361/699 |
| 7,699,538 B2 * | 4/2010 | Hayase et al. | 385/94 |
| 8,089,766 B2 * | 1/2012 | Attlesey | 361/699 |
| 2003/0197266 A1 | 10/2003 | Simon et al. | |
| 2007/0176613 A1 | 8/2007 | Ogawa et al. | |
| 2007/0280620 A1 * | 12/2007 | Matsuda et al. | 385/137 |
| 2008/0179622 A1 | 7/2008 | Herrmann | |
| 2009/0193652 A1 | 8/2009 | Salmon | |

FOREIGN PATENT DOCUMENTS

| | | | |
|---|---|---|---|
| GB | 2303939 A * | 7/1995 | |
| WO | 0250888 A2 | 6/2002 | |
| WO | 2005006454 A1 | 1/2005 | |

* cited by examiner

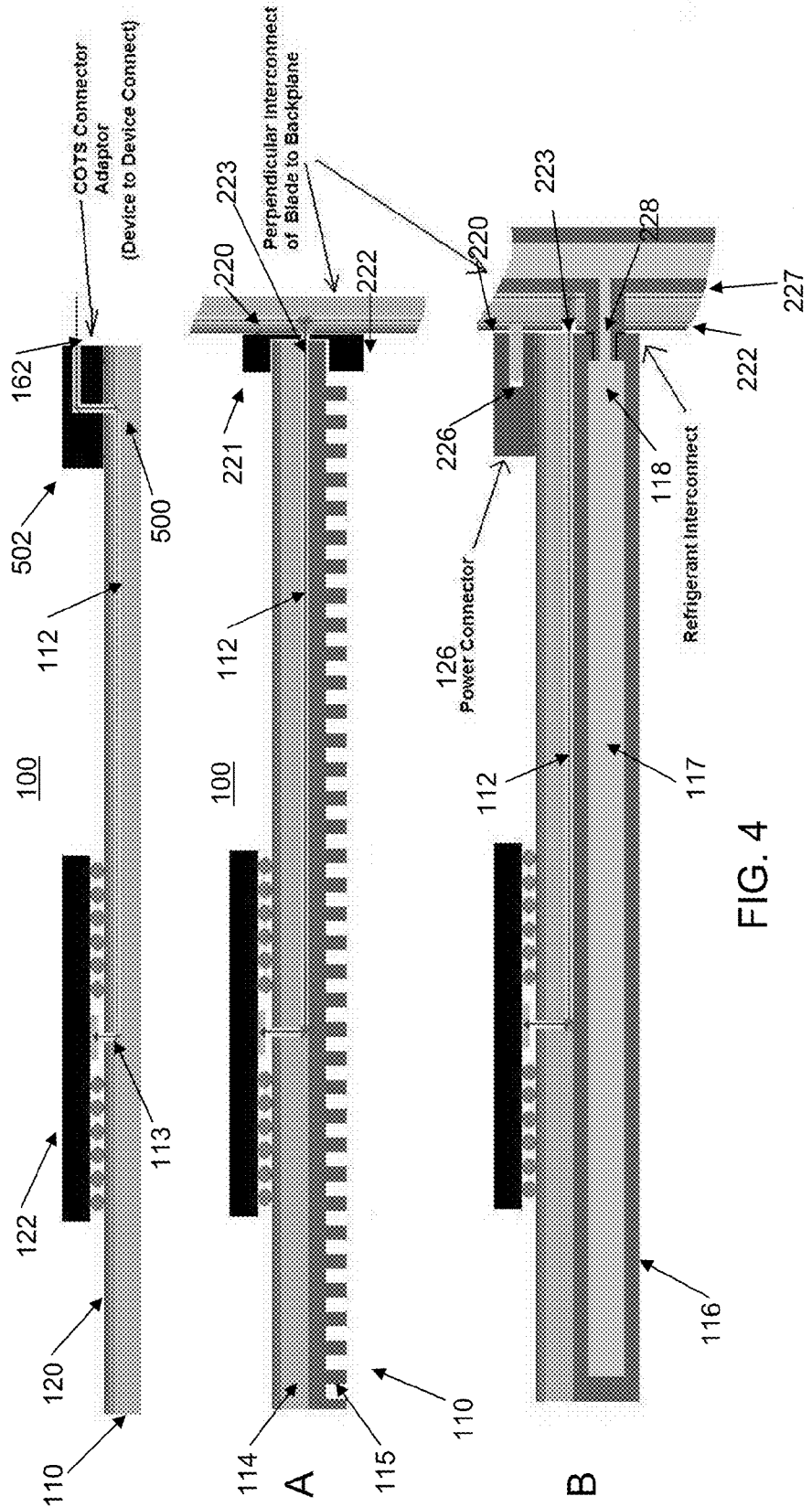

OPTICAL INTERCONNECTS IN COOLING SUBSTRATES

TECHNICAL FIELD

This invention relates to optical transmission of signals in electronic devices and to cooling-fluid channels in such devices.

BACKGROUND

As people communicate more and more using data networks, each time with more sophisticated applications, more network bandwidth is required to sustain efficiently and reliably the increasing demand for such communication and applications. As network bandwidth increases, new systems and components need to be developed and deployed, often requiring more powerful equipment that consumes more energy.

Environmental concerns are being addressed more than ever before in the electronic world, and so new building practices are gaining popularity, or at least, some interest. Among other aspects of network building practices, the system cooling and the electronic interconnect technologies bring interesting solutions/alternatives to the environmental challenge facing electronic system manufacturers.

In regard to cooling technologies used to extract heat generated by network systems, there exist several techniques, such as fans, radiators, liquid cooling, etc. Fans and radiators are commonly used due to their relatively low cost and other advantages, but they also suffer from disadvantages, such as noise, large space, environment dependence, etc. In fact, more and more problems related to noise generated by networking systems are being observed.

In addition, motherboards and other printed circuit boards (PCBs) that carry powerful digital signal processors and electronic circuits can require large radiators and/or fans attached directly to the processors and circuits. A "motherboard" is typically the main PCB in a device and is a slotted PCB upon which other PCBs ("daughter boards") can be mounted. As a result, a board can become thicker or taller, and not as space-efficient. Obtaining suitable air flow within a system chassis containing such boards can become an important challenge for a designer. As electronic equipment and boards "upgrade" from a blade form factor to a pizza-box form factor, the equipment's cooling air flow can have to be reconsidered or even replaced by liquid cooling.

It is common today to see copper traces between electronic components to carry information (hence the name, "printed circuit" board). Boards with copper traces will find it increasingly difficult to keep up with the increasing demand for low-power devices with higher-bandwidth communication. A possible solution may come from the use of optical components to carry signals between electronic components on a board and between boards. Copper interconnects require more power than optical interconnects for the same distance, and also require more copper traces to provide the same bandwidth. In short, using more and more optical components on boards and in system designs will make systems more energy efficient, more bandwidth capable, and probably easier to build, as less physical copper layers are required per electronic board.

U.S. Pat. No. 7,699,538 to Hayase et al. describes interconnecting electronic devices on a PCB with optical fibers and connectors, and enclosing all of them in a case having a shielding member (i.e., a cover) and a sealing member (i.e., a gasket). A liquid coolant flows on top of the PCB, contained by the shielding member and the sealing member and bathing the optical elements and other components on the PCB.

U.S. Patent Application Publication No. US 2009/0193652 by Salmon describes stacking several copper substrate modules and providing cooling channels between the stacked modules. Optical fibers pass perpendicularly through the modules.

Nevertheless, there are limitations on carrying optical signals between electronic components, especially related to the way the signals are carried. Typically, light needs a fiber optic bearer to carry the signals, such as a polymer that can be placed within a backplane of a electronic chassis. A "backplane" is typically a PCB having slots into which other PCBs, or blades or cards, are plugged, and is typically just a connector without many active components on it. While those technologies exist, they are still limited at least in that each connector introduces a significant signal loss and the polymer medium degrades the signal significantly over large distances, due also to important signal loss as a function of propagation distance.

Free-space optical bearers are being developed that may help minimize the energy required to transmit signals between electronic components while also avoiding connectors to interconnect different components.

U.S. Patent Application Publication No. US 2010/0028018 by Tan et al. for "Free-Space Optical Interconnect With Asymmetric Light Pipes" describes an optical interconnect system that includes components such as circuit boards, server blades, or a backplane with respective light pipes for an optical signal. The light pipe in a component transmitting the optical signal receives a collimated beam and directs the collimated beam for transmission. The light pipe in a receiving component is nominally aligned with the light pipe of the transmitting component and separated from the first light pipe by free space. The light pipe on the receiving side is larger than the light pipe on the transmitting side and can accommodate alignment error.

U.S. Patent Application Publication No. US 2009/0274467 by Morris et al. for "Free-space Photonic Connection Using Wavelength Division Multiplexing And Optical Antenna" describes an interconnect system having an optical transmitter mounted on a first circuit board and an optical receiver mounted on a second circuit board. The optical receiver can be nominally aligned to receive an optical signal through free space from the optical transmitter. The optical receiver includes one or more light detectors, and an optical antenna coupled to direct incident light into the one or more light detectors.

A free-space optical bearer on a PCB and/or a backplane would usually require a thick and rigid PCB or backplane. While it is possible to build a thick and rigid PCB or backplane, it is extremely difficult to use such technology in equipment such as chassis blades because of the space it requires. Thus, there is a need for improved electronic assemblies and backplanes.

SUMMARY

In accordance with an aspect of this invention, there is provided an assembly that includes a printed circuit board having at least one electronic circuit disposed thereon, a substrate in thermal contact with the printed circuit board and having a plurality of channels, and at least one of an optical transmitter and an optical receiver configured to pass an optical signal through at least one channel in the substrate. At least one of the channels is for a coolant to cool the at least one electronic circuit disposed on the printed circuit board, and at least one of the optical transmitter and the optical receiver is electrically connected to the at least one electronic circuit.

Also in accordance with aspects of this invention, there is provided a backplane that includes a substrate having a plurality of channels, at least one of the channels being for a coolant; a connector dimensioned for an assembly connected to the backplane; and an optical element configured to direct an optical signal through at least one channel in the substrate.

BRIEF DESCRIPTION OF THE DRAWINGS

The several features, objects, and advantages of this invention will be understood by reading this description in conjunction with the drawings, in which like reference characters indicate like parts and:

FIGS. 4A, 4B are cross-sectional views of portions of the equipment of FIG. 3 and assemblies depicted in FIGS. 2B, 2C; and FIG. 5 is a cross-sectional view of an assembly depicted in FIG. 2A.

DETAILED DESCRIPTION

As described in more detail below, the inventors have recognized that it is possible to combine fluid-cooling technology developed for PCBs and increasingly important optical-based interconnect technology, thereby enabling efficient fabrication of PCBs with free-space optical bearers. Since cooling components such as fans and heat sinks are no longer required on the PCB, because the PCB is cooled using a cooling substrate, the PCB is thinner. The PCB can also carry optical signals and in some instances can make better use of the cooling substrate by also using it to carry optical signals. A card or a backplane supporting a plurality of active components can combine optical signals and cooling aspects in support of those components.

Figure 1:
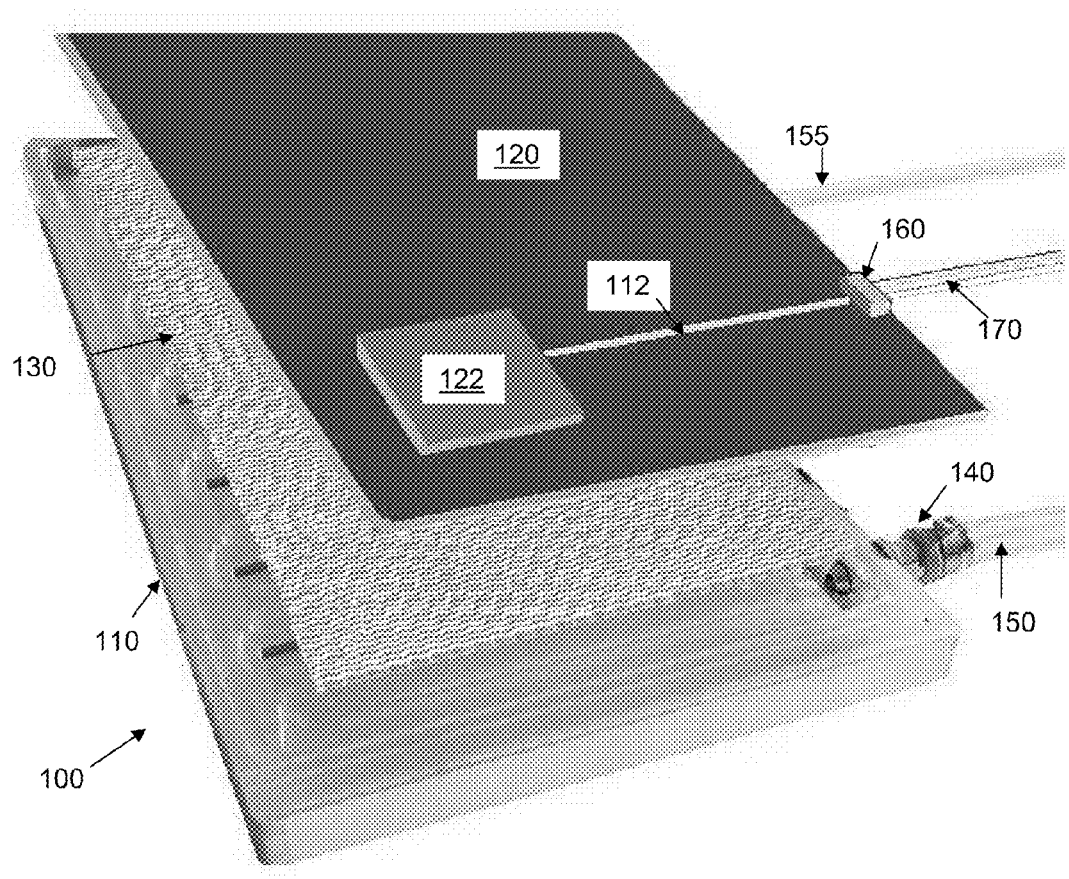
FIG. 1 is a perspective view of an assembly that includes a substrate configured for fluid cooling of a circuit board.

FIG. 1 is a perspective view of an assembly 100 that includes a substrate 110 configured for fluid cooling of a PCB 120. As schematically depicted in FIG. 1, the substrate 110 and PCB 120 are thermally joined by a suitable adhesive layer 130, but it will be appreciated that the substrate and PCB can be joined in any suitable manner, for example, by welding.

The substrate 110 includes a plurality of channels, or passages, for a coolant to extract heat from electronic or other components 122 that are suitably positioned on the PCB 120. As depicted in FIG. 1, liquid coolant can be introduced into the substrate 110 through a suitable fluid-tight fitting 140 from a hose 150 connected to a coolant reservoir (not shown). Coolant can be removed from the substrate through another fluid-tight fitting, which as depicted in FIG. 1 is hidden behind the PCB 120, and a hose 155 connected to the coolant reservoir. The components 122 can be mounted on the PCB 120 as usual, e.g., using different isolated copper layers to interconnect the components.

FIG. 1 also depicts an optical transmitter 160 disposed at an edge of the PCB 120. The transmitter 160 is advantageously a linear array of light-emitting semiconductors, such as light-emitting diodes, diode lasers, etc., that are responsive to signals provided by a ribbon cable 170. Suitable devices include vertical-cavity surface-emitting lasers (VCSELs), and distributed feedback (DFB) lasers. Such devices are commercially available from many sources, e.g., Finisar Corp., Sunnyvale, Calif., USA, and Princeton Optronics, Inc., Mercerville, N.J., USA. Optical signals generated by the transmitter 160 propagate to the components 122 through a channel 112 formed in the substrate 110, and so it will be noted that, for clarity in FIG. 1, the optical signals are depicted in relation to the PCB 120 as it would be assembled to the substrate 110. It will also be appreciated that FIG. 1 shows only one set of optical signals, but in general, multiple optical signals can propagate through multiple channels 112 in the substrate 110. Other configurations for the channels will be described below.

The substrate 110 includes a plurality of channels, or passages, that allow the coolant fluid to flow through the substrate according to the position and cooling requirements of the components of the PCB. Although the example shown in FIG. 1 assumes a liquid coolant, such as water or other heat-absorbing liquid, it will be understood that the coolant can be a gas, such as air, argon, nitrogen, and FREON refrigerant. In general, the coolant should be an inert fluid that discourages substrate corrosion. It will also be understood that liquid cooling typically requires a thick and rigid substrate 110, although it will be appreciated that a more flexible substrate can be used in some circumstances, for example, when the cooling fluid and optical signals use different channels through the substrate. The channels for the coolant can have virtually any shape, provided they enable the coolant to cool sufficiently the substrate and PCB components 122. Similarly, channels carrying optical signals do not have to be straight between interconnected components, provided mirrors and other suitable beam directors can be used efficiently to redirect the optical signals as needed.

For fluid cooling, the substrate 110 can be metallic, which is to say that it is formed of aluminum, copper, metal alloy, or other material that is thermally conductive and enables channels to be fabricated within it for a coolant and/or optical free-space signals. Aluminum is currently believed to be a typically good choice for the substrate 110 because of its light weight, its high thermal conductivity, and its rigidity, which ensures physically stable channels needed for free-space optical signals.

It will be understood that the fittings 140 and hoses 150, 155 are optional. The substrate 110 can be made of a material such that the substrate 110 with included passage(s) 112 is sufficient, substantially by itself, to provide the heat dissipation needed by the components 122. In an exemplary embodiment of such an assembly, a PCB 120 is joined to an aluminum substrate 110 that has one or more passages 112 grooved on the bottom of the substrate or, as depicted in FIG. 1, on the top of the substrate just beneath the PCB. One or more optical signals can propagate through the one or more free-space passages without requiring any specific coolant to flow within the substrate, other than ambient atmosphere.

It will be understood that the fittings 140 and hoses 150, 155 are optional also because a liquid or gas coolant can be arranged to flow in a closed loop either in or on the substrate 110 or the PCB 120. Such would then itself be simply cooled by the ambient atmosphere.

The inventors have noted that in a thick, rigid substrate, passages need to be made for the coolant to flow, and the substrate requirements for fluid cooling are similar to requirements for free-space optical bearers. For example in FIG. 1, the free-space optical signal that propagates through the passage 112 typically benefits from a thick, rigid substrate that enables light to travel unguided in a straight line without substantial loss. The light can be directed if needed by one or more mirrors disposed in the passage 112, for example by suitably shaping and polishing a wall or walls of the passage. Of course, coolant passages in the substrate can also be used to carry signal conductors, such as fiber optic and electrical cables.

Figure 2:
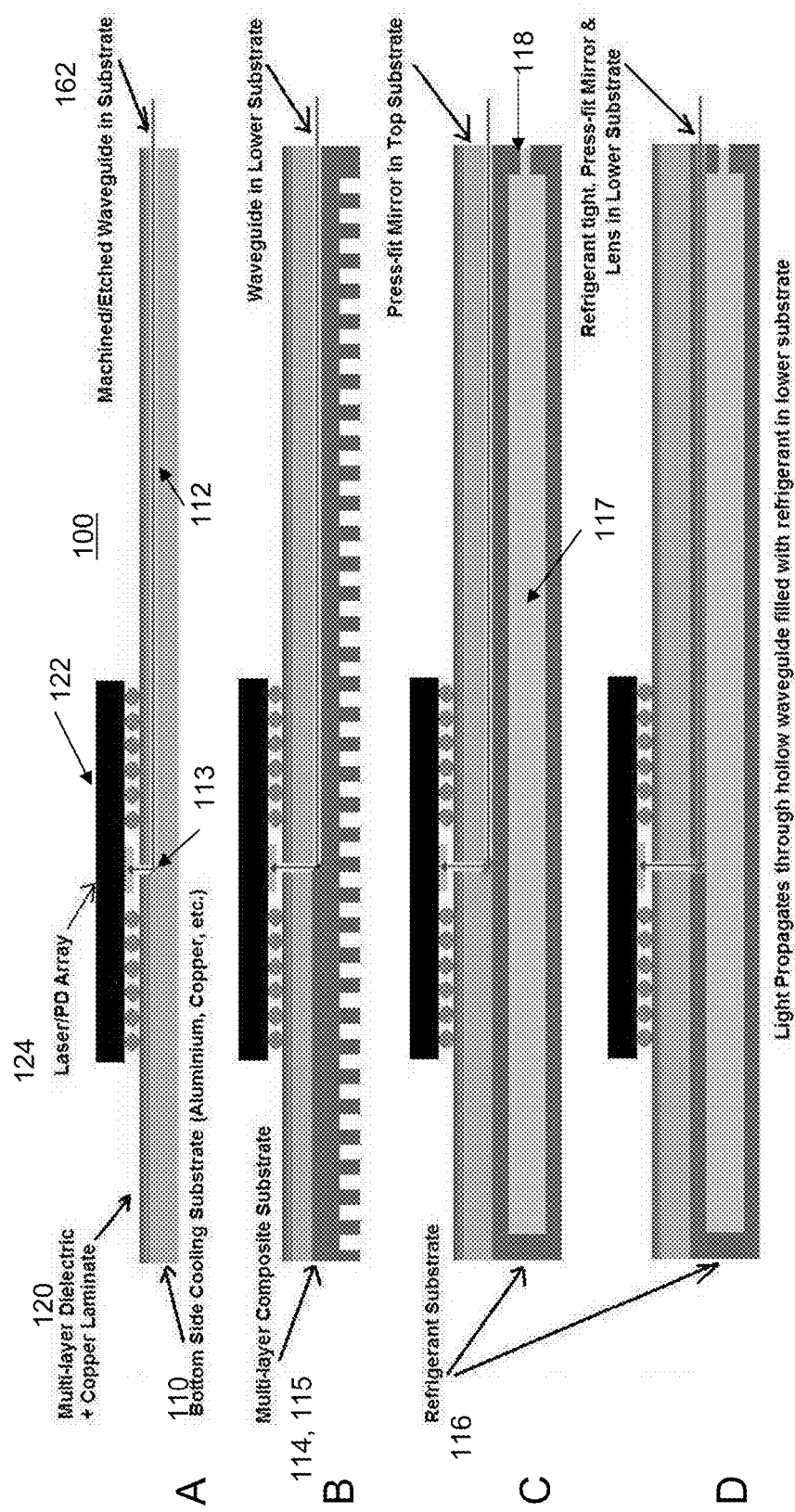
FIGS. 2A, 2B, 2C, 2D are cross-sectional views of embodiments of an assembly such as in FIG. 1.

FIGS. 2A, 2B, 2C, 2D are cross-sectional views of embodiments of an assembly 100 such as that shown in FIG. 1. As depicted in FIG. 2A, the passage 112 is formed in the top surface of the substrate 110 by a suitable process, such as machining, etching, etc. The top surface of the substrate 110 is thermally joined to the bottom surface of the PCB 120, which can be a multi-layer laminate of copper and a dielectric material. The passage 112 ends beneath the electronic component 122 at a mirror 113, which directs optical signals 162 propagating through the passage 112 to and/or from an optical receiver/transmitter 124 that is included in the component 122. The mirror 113 needs mainly to be suitably reflective at the wavelength or wavelengths of the optical signals 162, and so it can simply be formed directly in a metallic substrate 110 or by deposition of one or more suitable coatings. It will be appreciated that in general the optical receiver/transmitter 124 can be disposed on the PCB 120 and in the component 122 in any suitable position, and the formation of the passage 112 and mirror 113 would change accordingly.

The assembly depicted in FIG. 2B is similar to the assembly depicted in FIG. 2A. In FIG. 2B, the substrate 110 comprises a first layer 114 attached to the bottom of the PCB 120 as in FIG. 2A and a second layer 115 attached to the bottom of the first layer. The second layer 115 is thermally joined to the first layer and is depicted as having a plurality of fins on its bottom surface to enhance cooling. In the embodiment depicted in FIG. 2B, the passage 112 is formed in the top surface of the second layer 115 of the substrate by a suitable process, such as machining, etching, etc.

The assembly depicted in FIG. 2C is similar to the assemblies depicted in FIGS. 2A, 2B. In FIG. 2C, the substrate 110 comprises a first layer 114 attached to the bottom of the PCB 120 as in FIGS. 2A, 2B and a second layer 116 attached to the bottom of the first layer. The second layer 116 is thermally joined to the first layer 114 and is depicted as having an interior passage or volume 117 for a coolant, such as a liquid, that passes through an aperture 118 at an end of the volume 117. In the embodiment depicted in FIG. 2C, the channel 112 is formed in the bottom surface of the first layer 114 of the substrate by a suitable process, such as machining, etching, etc. The channel 112 ends beneath the electronic component 122 at the mirror 113, which can simply be formed directly in a metallic first layer 114, by deposition of one or more suitable coatings, or by press-fitting a suitably dimensioned mirror into the first layer of the substrate.

The assembly depicted in FIG. 2D is similar to the assemblies depicted in FIGS. 2A, 2B, 2C. In FIG. 2D, the substrate 110 comprises a first layer 114 attached to the bottom of the PCB 120 as in FIGS. 2A, 2B, 2C and a second layer 116 attached to the bottom of the first layer as in FIG. 2C. In the embodiment depicted in FIG. 2D, the passage 112 is formed in the top surface of the volume 117 in the second layer 116 by a suitable process, such as machining, etching, etc. The mirror 113 can simply be formed by press-fitting a suitably dimensioned mirror into the top surface of the volume 117 such that it is liquid-coolant-tight. In addition, as the passage 112 is bathed in the coolant such that the optical signals 162 pass through the coolant, a suitable lens or other optical beam-former can be included with the mirror 113.

Compared to a copper signal connection, a free-space optical bearer in accordance with this invention has advantages of independence from the propagation speed and loss limitations imposed by traditional connection practices. For example, a copper conductor carrying a 10 gigahertz signal can as a practical matter be no more than about 30 centimeters long. Optical bearers also avoid signal degradations inherent in using connectors to interconnect different PCBs and/or electronic components.

Besides combining fluid cooling and free-space optical bearers in the design of PCBs, the combination can also be applied in backplanes. In large telecom systems, for example, several processor blades are mounted in a chassis and exchange signals through a common backplane in the chassis. As each blade usually needs to exchange information with other blades and external devices, each blade has to connect to the backplane, which then relays the signals to the other blades and devices.

Figure 3:
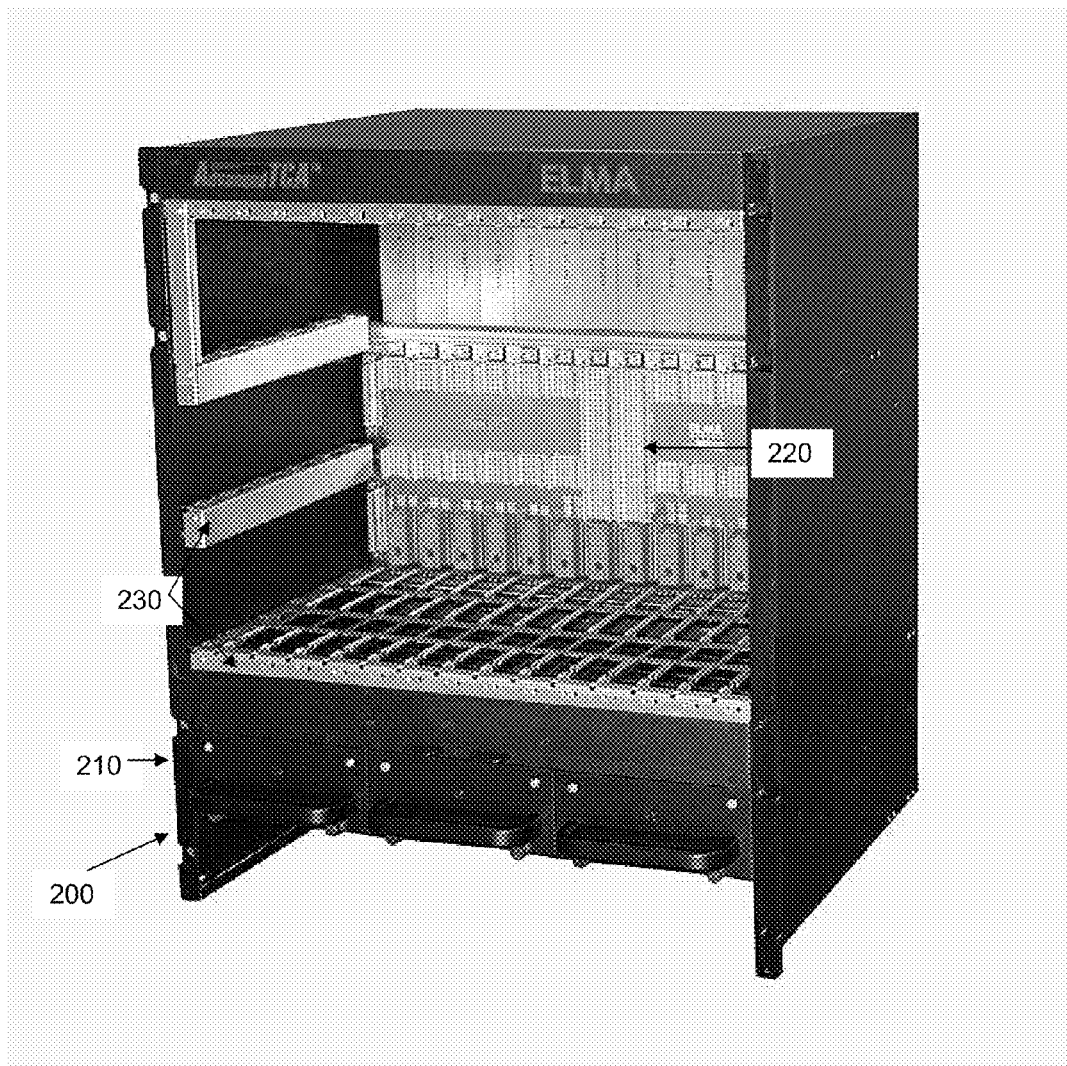
FIG. 3 is a perspective view of an equipment that includes a backplane for accepting one or more assemblies as depicted in FIGS. 1 and 2.

FIG. 3 depicts an exemplary equipment 200 that includes a chassis 210, a backplane 220 and racks 230. As depicted in FIG. 3, the racks 230 and backplane 220 cooperate to provide slots for connecting fourteen blades (not shown), such as the assemblies 100. In particular, typical manufacturing tolerances of ±100 micrometers (±0.004 inch) on the passages in a substrate 110 and a backplane 220 are sufficient to ensure adequate continuity of a passage between a substrate and the backplane.

It will be appreciated that many aspects of the backplane 220 and an assembly 100 are similar. For example, the backplane 220 can also includes a substrate configured for fluid cooling of a PCB that is thermally joined by a suitable adhesive layer to the substrate. Like the substrate 110, the backplane's substrate can include a plurality of channels, or passages, for a coolant to extract heat from the blades, backplane, and chassis. The channels for the coolant can have virtually any shape, provided they enable the coolant to cool sufficiently, and channels carrying optical signals do not have to be straight between interconnected assemblies or components, provided mirrors and other suitable beam directors can be used efficiently to redirect the optical signals as needed. The backplane's substrate can be metallic, which is to say that it is formed of aluminum, copper, metal alloy, or other material that is thermally conductive and enables channels to be fabricated within it for a coolant and/or optical free-space signals.

FIGS. 4A, 4B are cross-sectional views of portions of a backplane 220 as depicted in FIG. 3 and assemblies 100 similar to those depicted in FIG. 2B, that illustrate how an assembly can connect to a backplane. As depicted in FIG. 4A, the substrate 110 comprises the first layer 114 attached to the bottom of the PCB 120 and the second layer 115 attached to the bottom of the first layer, with the passage 112 formed in the bottom surface of the first layer. The passage 112 ends beneath the electronic component 122 at a mirror 113, which directs optical signals 162 propagating through the passage 112 to and/or from an optical receiver/transmitter 124 that is included in the component 122.

As depicted in FIG. 4A, the assembly 100 is suitably dimensioned such that it fits into a connector 221 on the backplane 220 so that optical signals 162 in the passage 112 can propagate to and from a corresponding passage 222 in the backplane. As indicated in FIG. 4A, the passage 222 includes an element 223 that directs optical signals 162 propagating through the passages 112, 222. The element 223 is preferably an optical diplexer, which generally is a translucent mirror that reflects optical signals from a PCB component 122 into two paths, which are toward the left and right of the backplane 220 as seen in FIG. 3 (top and bottom of FIG. 4A). The diplexer 223 also reflects optical signals from both sides of the backplane toward the PCB component. Optical diplexers are commercially available from a number of sources, e.g., Versa Technology, Inc., Chino, Calif., USA, and Sumitomo Electric Europe Ltd., Elstree, UK.

As depicted in FIG. 4B, the substrate 110 comprises the first layer 114 attached to the bottom of the PCB 120 and a second layer 116 attached to the bottom of the first layer that has the interior volume 117 for a coolant that passes through the aperture 118. As in FIG. 2C, the passage 112 is formed in the bottom surface of the first layer 114 of the substrate 110 and has the mirror 113, which directs optical signals 162 propagating through the passage 112.

As depicted in FIG. 4B, the PCB 120 includes an electrical connector 126 that mates to an electrical connector 226 on the backplane 220 so that electrical signals and power can be provided to the PCB 120 from the backplane. As indicated in FIG. 4B, optical signals 162 in the passage 112 can propagate to and from a corresponding passage 222 in the backplane, and the passage 222 includes a diplexer element 223 that directs optical signals 162 propagating through the passages 112, 222. Coolant can flow between the volume 117 in the substrate 110 and a volume 227 in the backplane 220 through a fluid-tight connection between the aperture 118 and a corresponding aperture 228 in the volume 227. The fluid connection or connections between an assembly 100 and backplane 220 preferably enable the assembly to be connected and disconnected from the backplane without coolant leakage. The aperture 228 and its surrounding backplane structure can be suitably shaped such that they can be used for aligning an assembly to the backplane, thereby properly aligning optical signals between the assembly and the backplane.

It will be understood that optical signals can be provided to/from other devices without the need for a backplane or other parts of the equipment 200. For example, FIG. 5 is a cross-sectional view of an assembly 100 such as that shown in FIG. 2A. The optical signals 162 propagate through the passage 112 formed in the top surface of the substrate 110. One end of the passage 112 ends beneath the electronic component 122 at a mirror 113, which directs the optical signals 162 to and/or from the component 122. The other end of the passage 112 ends at a similar mirror 500, which directs the optical signals 162 to and/or from a suitable commercial off-the-shelf (COTS) fiber optic connector 502 that enables the optical signals 162 to be directed to other assemblies 100 and/or components on the PCB 120. Suitable COTS connectors are commercially available from many sources, such as American Fiber Optic Technologies, Virginia Beach, Va., USA, and Tyco Electronics, Berwyn, Pa., USA. It should be understood that the connector 502 can be replaced by another component 122 on the PCB 120, illustrating the case in which optical signals 162 can be directed between different components 122 on the same PCB 120.

It will be appreciated that a free-space optical bearer and fluid cooling can be combined in a backplane whether or not they are combined in blades that are connected through the backplane. For example, a backplane is shared between a number of blades in a chassis, and so can cool the chassis to a certain extent. Additional chassis and blade cooling can be provided if necessary by otherwise conventional fans and heat sinks disposed on either the blades, the backplane, or both. Furthermore, the backplane can easily be thick and rigid, and typically carries signals on relatively long distances between blades.

Although a free-space optical bearer on a PCB and/or a backplane normally requires a thick and rigid PCB or backplane, combining the free-space optical bearer technology with fluid substrate cooling makes it possible to build PCBs without fans and heat sinks. The electronic circuit components that generate the most heat are also usually those that send/receive the most data, and so the locations of coolant passages are highly correlated with the locations of desired passages for optical signals. As a result, the PCBs are thinner and can fit within the tight space requirements of server blades and backplane chassis.

Free-space optical bearers on PCBs can be useful to minimize the energy required to carry optical signals, as there is no loss due to connectors and the bearer itself, e.g., a fiber optic cable or a polymer conductor. Typically, connectors are required to interconnect a blade to a chassis backplane, and such connectors are subject to dirt contamination, which can degrade considerably optical signals. Using a free-space optical bearer avoids the concern of keeping a connector clean. Also, there is substantially no limit on the bandwidth of a free-space optical bearer, as additional carrier wavelengths can be added as necessary.

Separate channels in the substrate can carry coolant and optical signals, but the same channels can be used for both purposes. Although some coolants may be opaque to the desired optical signal or may distort the optical signal, other coolants, especially gases such as air, argon, etc. can have minimal negative effects on the optical signal, and with cooling channels and optical channels co-located in the same substrate, embodiments of this invention can be less complex to manufacture and use that prior devices.

It will be understood that this invention can be embodied in an assembly 100 by itself, or a combination of an assembly 100 and a backplane 220, or a backplane 220 by itself. In other words, this invention can be embodied in a PCB, in which different electronic devices on the PCB use the substrate for cooling and for optical-based communication channels that pass through the substrate. Interconnecting one or more such PCBs to a backplane should be considered optional. As described above, however, this invention can be embodied in a backplane, as well as in both PCBs and a backplane at once with suitable interfaces between the PCBs and the backplane.

It will be appreciated that procedures described above are carried out repetitively as necessary, for example, to respond to the time-varying nature of communication signals exchanged by transmitters and receivers. Assemblies implementing this invention can be included in, for example, computers, servers, wireless communication network base stations, and the like.

Thus, the invention may be embodied in many different forms, not all of which are described above, and all such forms are contemplated to be within the scope of the invention.

It is emphasized that the terms "comprises" and "comprising", when used in this application, specify the presence of stated features, integers, steps, or components and do not preclude the presence or addition of one or more other features, integers, steps, components, or groups thereof.

The particular embodiments described above are merely illustrative and should not be considered restrictive in any way. The scope of the invention is determined by the following claims, and all variations and equivalents that fall within the range of the claims are intended to be embraced therein.

What is claimed is:

1. An assembly, comprising:
   a printed circuit board having at least one electronic circuit disposed thereon;
   a substrate in thermal contact with the printed circuit board and having a plurality of channels, wherein at least one of the channels is for a coolant to cool the at least one electronic circuit disposed on the printed circuit board; and at least one of an optical transmitter and an optical receiver configured to pass an optical signal through at least one channel in the substrate, wherein at least one of the optical transmitter and the optical receiver is electrically connected to the at least one electronic circuit.

2. The assembly of claim 1, wherein a channel for a coolant is a channel configured to pass the optical signal.

3. The assembly of claim 1, wherein the substrate is metallic, and the coolant is a gas.

4. The assembly of claim 1, wherein at least one of the optical transmitter and the optical receiver is a linear array of semiconductors.

5. The assembly of claim 4, wherein the linear array is disposed in a channel of the substrate.

6. The assembly of claim 1, wherein the substrate is metallic, and the coolant is a liquid.

7. The assembly of claim 1, wherein the assembly is configured to be disposed in a backplane such that at least one channel in the substrate is substantially continuous with at least one channel in the backplane and that the optical signal propagates through the continuous channels in the substrate and backplane.

8. The assembly of claim 7, wherein the continuous channels are channels for the coolant.

9. A backplane, comprising:
a substrate having a plurality of channels, wherein at least one of the channels is for a coolant;
a connector dimensioned for an assembly connected to the backplane; and
an optical element configured to direct an optical signal originating from the assembly through at least one channel in the substrate.

10. The backplane of claim 9, wherein a channel for the coolant is a channel configured to pass the optical signal directed by the optical element.

11. The backplane of claim 9, wherein the optical element is a diplexer.

12. The backplane of claim 11, wherein the at least one channel through which the optical element directs the optical signal is configured to be substantially continuous with a channel in the assembly connected to the backplane.

13. The backplane of claim 9, further comprising an electrical connector configured to mate with an electrical connector on the assembly.

14. The backplane of claim 9, wherein the substrate is metallic, and the coolant is a gas.

15. The backplane of claim 9, wherein the substrate is metallic, and the coolant is a liquid.

* * * * *